United States Patent
Schmitt et al.

(10) Patent No.: US 11,251,053 B2
(45) Date of Patent: Feb. 15, 2022

(54) PROCESS FOR PRODUCING AN ELECTRODE IN A BASE SUBSTRATE AND ELECTRONIC DEVICE

(71) Applicant: STMicroelectronics (Crolles 2) SAS, Crolles (FR)

(72) Inventors: Joel Schmitt, Isere (FR); Bilel Saidi, Grenoble (FR); Sylvain Joblot, Bourgoin-Jallieu (FR)

(73) Assignee: STMicroelectronics (Grolles 2) SAS, Crolles (FR)

( * ) Notice: Subject to any disclaimer, the term of this patent is extended or adjusted under 35 U.S.C. 154(b) by 0 days.

(21) Appl. No.: 16/990,556

(22) Filed: Aug. 11, 2020

(65) Prior Publication Data
US 2021/0050224 A1 Feb. 18, 2021

(30) Foreign Application Priority Data
Aug. 14, 2019 (FR) ...................................... 1909210

(51) Int. Cl.
| | |
|---|---|
| H01L 21/00 | (2006.01) |
| H01L 21/3205 | (2006.01) |
| H01L 21/285 | (2006.01) |
| H01L 21/321 | (2006.01) |
| H01L 21/3215 | (2006.01) |
| H01L 23/528 | (2006.01) |

(52) U.S. Cl.
CPC .. H01L 21/32055 (2013.01); H01L 21/28556 (2013.01); H01L 21/3212 (2013.01); H01L 21/32155 (2013.01); H01L 23/528 (2013.01)

(58) Field of Classification Search
CPC ......... H01L 21/32055; H01L 21/28556; H01L 21/3212
See application file for complete search history.

(56) References Cited

U.S. PATENT DOCUMENTS

| | | | |
|---|---|---|---|
| 5,582,640 A | 12/1996 | Okada et al. | |
| 7,115,933 B2 * | 10/2006 | Menut ............... | H01L 27/10832 257/301 |
| 2002/0094678 A1 * | 7/2002 | Menut ............... | H01L 21/76235 438/663 |
| 2002/0113233 A1 * | 8/2002 | Menut ............... | H01L 27/14643 257/46 |
| 2002/0119620 A1 * | 8/2002 | Menut ............... | H01L 27/10867 438/241 |
| 2012/0261670 A1 * | 10/2012 | Marty ................. | H01L 27/1464 257/72 |

(Continued)

FOREIGN PATENT DOCUMENTS

JP H0272658 A 3/1990

OTHER PUBLICATIONS

INPI Search Report and Written Opinion for FR 1909210 dated Apr. 9, 2020 (12 pages).

*Primary Examiner* — Laura M Menz
(74) *Attorney, Agent, or Firm* — Crowe & Dunlevy

(57) ABSTRACT

An electrode is included in a base substrate. A trench is produced in the base substrate. The trench is filled with an annealed amorphous material to form the electrode. The electrode is made of a crystallized material which includes particles that are implanted into a portion of the electrode that is located adjacent the front-face side of the base substrate.

26 Claims, 5 Drawing Sheets

(56) References Cited

U.S. PATENT DOCUMENTS

2012/0261732 A1* 10/2012 Marty ............... H01L 27/14689
 257/292
2017/0287942 A1* 10/2017 Wang ................ H01L 21/28512
2021/0050224 A1* 2/2021 Schmitt ............ H01L 21/32055

* cited by examiner

PROCESS FOR PRODUCING AN ELECTRODE IN A BASE SUBSTRATE AND ELECTRONIC DEVICE

PRIORITY CLAIM

This application claims the priority benefit of French Application for Patent No. 1909210, filed on Aug. 14, 2019, the content of which is hereby incorporated by reference in its entirety to the maximum extent allowable by law.

TECHNICAL FIELD

The present invention relates to the field of microelectronics and, in particular, to a method for making a microelectronic device.

BACKGROUND

When fabricating integrated electronic components, for example CMOS components, electrodes are produced in trenches in a base substrate. In particular, these electrodes are associated with other electrodes via a dielectric layer such that they are capacitively coupled to one another.

In general, the trenches are filled with amorphous silicon which, in a later step, is annealed so that the amorphous silicon is oxidized and crystallized, and thus becomes electrically conductive.

However, the crystallization process is often incomplete and results in the formation of microbubbles or nanobubbles within the now-conductive crystallized material and microcraters or nanocraters at the surface. These defects, which are present in particular within the thickness of the electrode adjacent to the aforementioned dielectric layer, result in a decrease in the voltage referred to as the breakdown voltage and decreased voltage withstand over time.

SUMMARY

According to one embodiment, what is proposed is a process for producing an electrode in a base substrate, comprising the following steps: producing at least one trench in the base substrate, starting from a front face thereof; filling the trench with an amorphous material; implanting particles into the portion of the filler material that is located on the front-face side of the base substrate; and carrying out an annealing heat treatment for oxidizing and crystallizing the filler material so as to form, in the trench, an electrically conductive electrode.

Thus, by virtue of the ion implantation process, there is, within the implanted thickness, a change in the oxidation and in the crystallization of the amorphous material and a change in the texture of the grains of the crystallized material, countering the formation of microbubbles or nanobubbles and microcraters or nanocraters at the surface, such that the surface state of the electrode and the interface with a layer bonded to the electrode are improved, and the voltage referred to as the breakdown voltage and the voltage withstand over time are increased.

The trench may be produced by etching.

The amorphous material may be deposited by CVD (chemical vapour deposition) or ALD (atomic layer deposition).

The operation of implanting particles may be performed by means of plasma ion implantation.

The amorphous material may be amorphous silicon and the electrode is crystallized silicon or polysilicon.

The process may comprise the following step: before the step of implanting particles, removing, by means of chemical-mechanical polishing, the layer of filler material deposited on top of the front face of the base substrate.

The process may comprise, before the filling step, the following step: producing an intermediate dielectric layer on the walls of the trench.

The process may comprise the following step: before the step of implanting particles, removing, by means of chemical-mechanical polishing, the dielectric layer deposited on top of the front face of the base substrate along with the intermediate dielectric layer.

The dielectric layer may be made of silicon oxide.

The front face of the base substrate may be covered beforehand with a temporary layer forming a mask through which the trench is produced by etching.

The process may comprise the following step: after the heat treatment, removing the temporary layer.

The process may comprise: carrying out a step of selectively chemically etching the front portion of the filler, the depth of which corresponds to the thickness of the temporary layer.

The temporary layer may be silicon nitride.

The process may comprise a later step of depositing a front dielectric layer on top of the front face of the base substrate, this front dielectric layer covering the formed electrode.

The process may comprise a later step of depositing a local electrically conductive layer on top of the front dielectric layer, this local layer being located above the electrode.

An electronic device is also proposed which comprises: a base substrate having a front face, and wherein a trench is formed starting from this front face; and an electrically conductive electrode formed in the trench, wherein the portion of the electrode located on the front-face side of the base substrate comprises particle implants or inclusions.

The device may comprise an intermediate dielectric layer that covers the walls of the trench; the intermediate dielectric layer being interposed between the walls of the trench and the electrode.

The device may comprise a front dielectric layer on top of the front face of the base substrate, covering the electrode.

The device may comprise a local electrically conductive layer on top of the front dielectric layer, located above the electrode.

BRIEF DESCRIPTION OF THE DRAWINGS

An electronic device including an integrated electrode and modes of fabrication of this electronic device will now be described by way of exemplary embodiments, illustrated by the drawing, in which.

DETAILED DESCRIPTION

Figure 1:
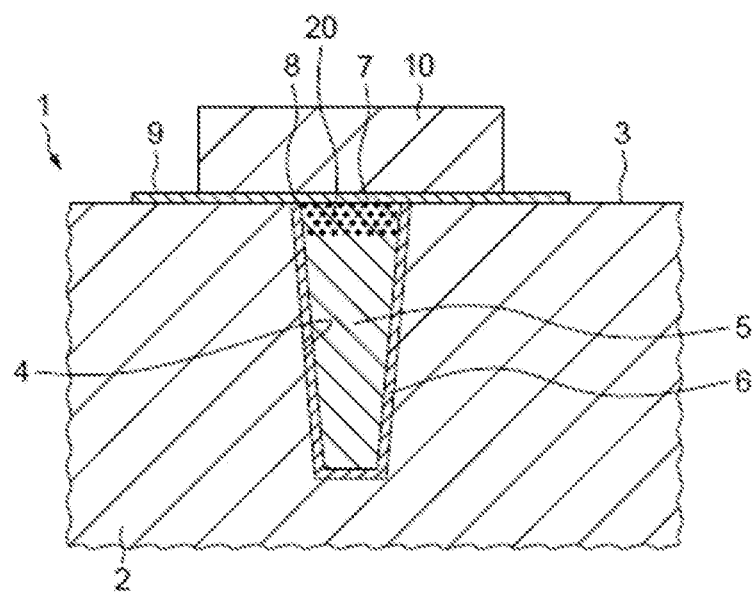
FIG. 1 shows a section through an electronic device.

An integrated electronic device 1, illustrated in FIG. 1, comprises a base substrate 2, for example made of silicon, which has a front surface 3 and in which at least one trench 4, open on the front-face 3 side, is formed.

The integrated electronic device 1 comprises an integrated electrode 5, for example made of polysilicon, which is formed in the trench 4 in the base substrate 2.

The integrated electronic device 1 comprises an intermediate dielectric layer 6, for example made of silicon oxide, which is inserted between the walls of the trench 4 and the electrode 5. There is therefore capacitive coupling between the electrode 5 and the base substrate 2.

The front face 7 of the electrode 5 and the end edge 8 of the intermediate dielectric layer 6 lie in the plane of the front face 3 of the base substrate 2.

According to one variant embodiment, the integrated electronic device 1 comprises a front dielectric layer 9, for example made of silicon oxide, which covers, locally around the trench 4, the front face 3 of the base substrate 2, and which covers the front face 7 of the electrode 5 and the end edge 8 of the intermediate dielectric layer 6.

The integrated electronic device 1 further comprises a front local conductive layer 10 which lies locally on top of the front dielectric layer 9, in the region above the electrode 5. This front local conductive layer 10 is for example made of doped polysilicon (doped with As, P, B or other) or of metal (TiN, TaN, TiAlN, W, Al or other).

There is therefore capacitive coupling between the electrode 5 and the front local conductive layer 10.

The structure described above may advantageously form part, for example an electrical contact, of a CMOS integrated electronic component.

The integrated electronic device 1 is fabricated in the following way.

Figure 2:
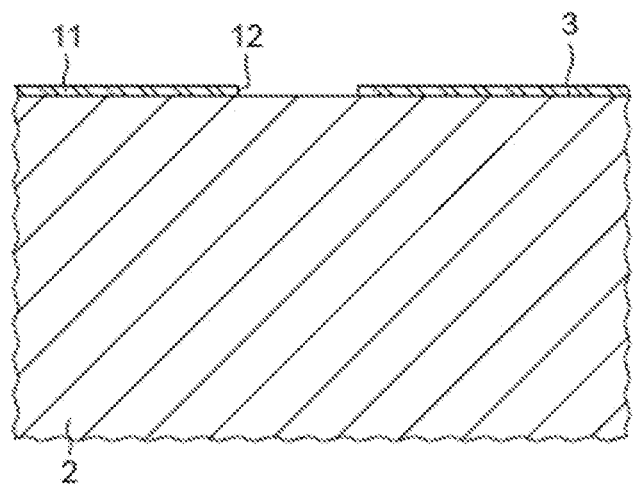
FIGS. 2-10 show steps in a method of fabricating the electronic device of FIG. 1.

As illustrated in FIG. 2, the front face 3 of a base substrate 2 is covered with a temporary layer 11, forming a barrier, for example of silicon nitride, in which an opening 12 is made by means of local chemical attack through a mask.

Figure 3:
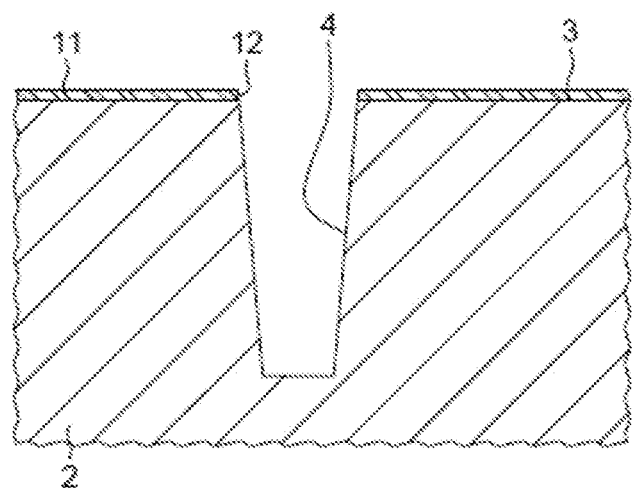

Next, as illustrated in FIG. 3, a step of selectively chemically etching the base substrate 2 through the opening 12 in the temporary layer 11 is carried out so as to obtain the trench 4.

Figure 4:
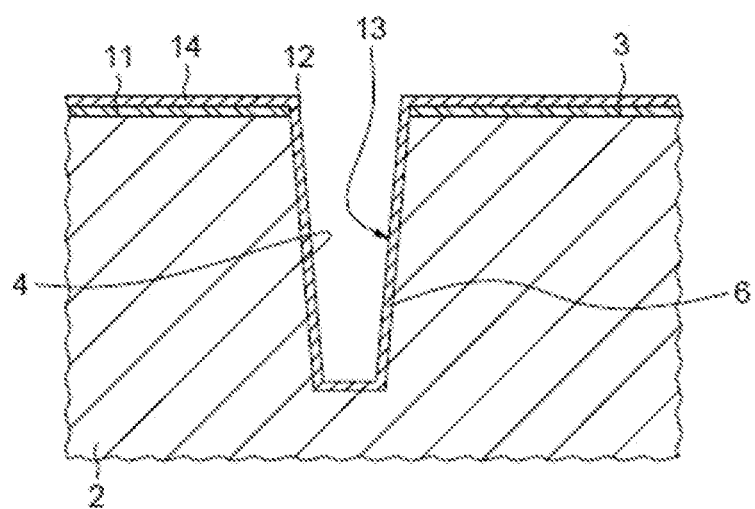

Next, as illustrated in FIG. 4, a step of depositing 13 a dielectric material, for example made of silicon oxide, is performed by means of a CVD (chemical vapor deposition) or ALD (atomic layer deposition) process so as to obtain the dielectric layer 6 over the entire wall of the trench 4. This deposition process 13 results in the formation of a front layer 14 on top of the temporary layer 11, which also covers the flanks of the opening 12.

Figure 5:
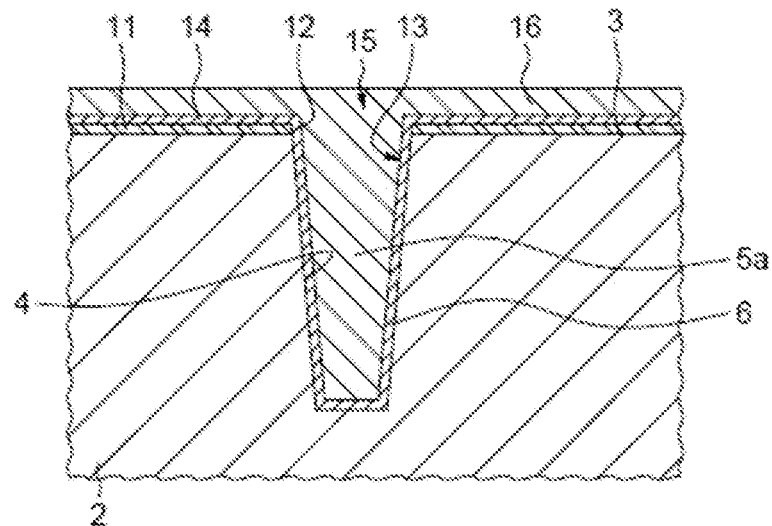

Next, as illustrated in FIG. 5, a step of depositing 15 an amorphous material, for example amorphous silicon, is performed by means of a CVD (chemical vapor deposition) process so as to fill the trench 4 with a filler 5a, the dielectric layer 6 thus being interposed between the base substrate 2 and this filler 5a. This deposition process 15 results in the formation of a front layer 16 on top of the front layer 14.

Figure 6:
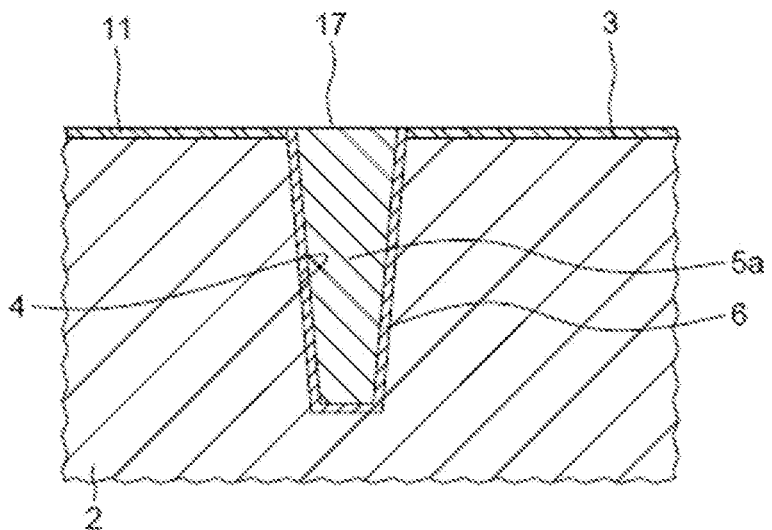

Next, as illustrated in FIG. 6, a step of chemical-mechanical polishing (CMP) down to the temporary layer 11 is performed so as to remove the front layer 16 and the front layer 14. The filler 5a then has a front face 17 in the plane of the front face of the temporary layer 11.

Figure 7:
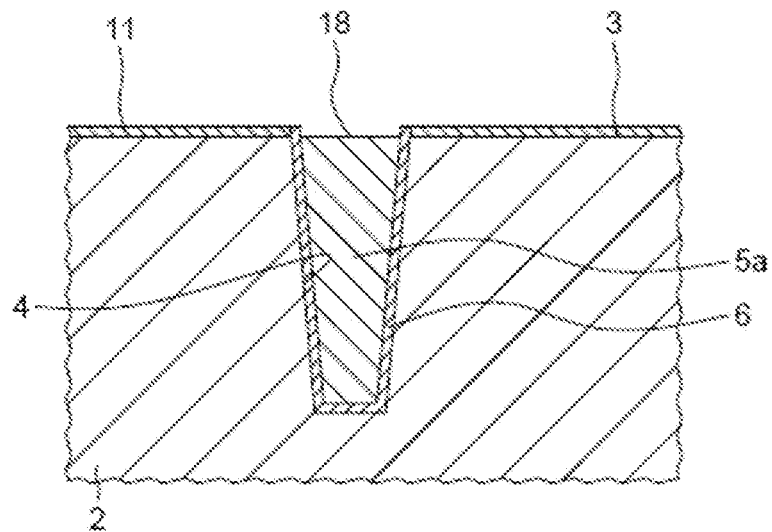

Next, as illustrated in FIG. 7, a step of selectively chemically etching the front portion of the filler 5a is performed so that the front face 18 of this filler 5a is set back (also referred to as recessed), this set-back front face 18 lying roughly in the plane of the front face 3 of the base substrate 2 or being set back with respect to this front face 3. Thus, the depth of the chemical etch corresponds to the thickness of the temporary layer 11.

Figure 8:
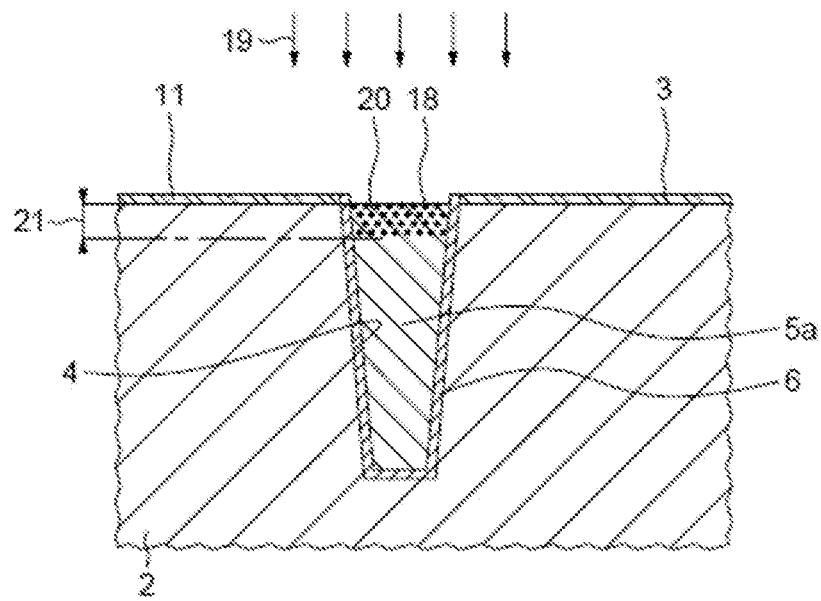

Next, as illustrated in FIG. 8, a step of implanting particles 20 is performed by means of plasma ion implantation 19 throughout the entirety of a front thickness 21 of the filler 5a located on the front-face 3 side of the base substrate 2, between the peripheral dielectric layer 6 via the set-back front face 18.

The temporary layer 11 and the dielectric layer 6 form barriers to implantation into the base substrate 2.

Since the filler 5a is made of amorphous silicon, the implanted particles 20 are advantageously fluorine particles.

Figure 9:
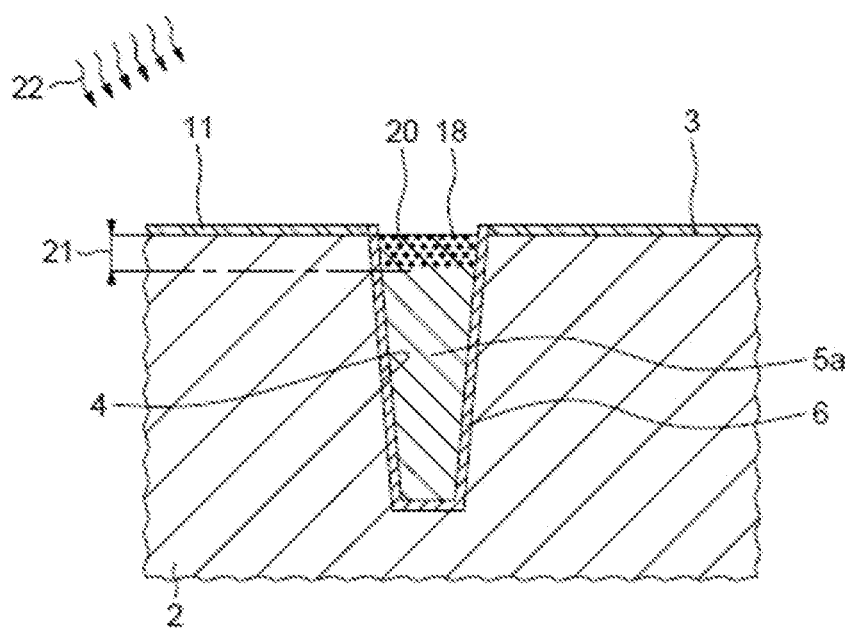

Next, as illustrated in FIG. 9, a step is performed in which an annealing heat treatment 22 for oxidizing and crystallizing the filler material 5a is carried out in an oven so as to form, in the trench 4, the electrically conductive electrode 5 made of crystallized silicon or polysilicon, separated from the base substrate 2 by the dielectric layer 6.

By virtue of the prior operation of ion-implanting fluorine particles into the amorphous silicon, there is, within the implanted front thickness 21 of the filler 5a, a change in the oxidation and in the crystallization of the amorphous material in relation to the rest of the filler 5a, and a change in the texture of the grains in the crystallized material. The effect of this is to counter the formation of microbubbles or nanobubbles and microcraters or nanocraters at the surface such that the surface state 18 of the electrode 5, up to its edges adjacent to the dielectric layer 6, is improved.

Figure 10:
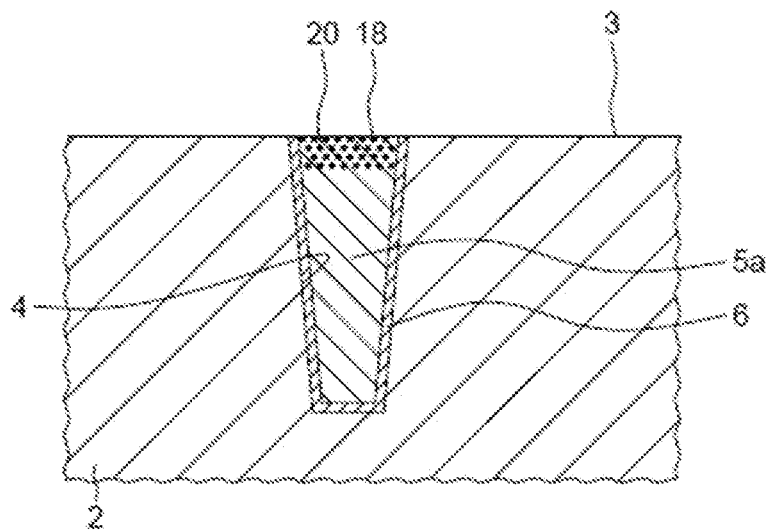

After this, as illustrated in FIG. 10, a step is performed in which a selective chemical attack is carried out so as to remove the temporary layer 11. The front face 18, which was previously set back, then forms the front face 7 of the electrode 5 (coplanar with the face 3 of the substrate 2.

Then, in later steps, the dielectric layer 9 and the conductive layer 10 are deposited so as to obtain the device 1 of FIG. 1.

By virtue of the improved state of the surface 18 of the electrode 5, the interface 7 between the electrode 5 in the dielectric layer 9, which are adjacent, is improved such that the voltage referred to as the breakdown voltage and the voltage withstand over time are increased.

According to one variant embodiment, the ion implantation step 19 of FIG. 8 could be performed before the step of selectively chemically etching the front portion of the filler 5a of FIG. 7.

According to one variant embodiment, the electrode 5 could be connected to an electrical connection line that passes through the base substrate 2, which line is electrically insulated and reaches the deep portion of the electrode 5 opposite its front face 7.

Of course, the electronic device 1 may comprise a plurality of trenches 4, for example in parallel, provided, respectively, with electrodes 5 separated from the base substrate 2 by dielectric layers 6. The fabrication steps described above are then performed simultaneously in order to obtain such an electrical device.

The invention claimed is:

1. A process for producing an electrode in a base semiconductor substrate, comprising the following steps:
producing a trench extending into the base semiconductor substrate from a front face thereof;
filling the trench with an amorphous material;
implanting particles into a first portion of the amorphous material filing the trench that is located adjacent the front face of the base semiconductor substrate without implanting particles into a second portion of the amorphous material filing the trench that is located in the trench below the first portion; and
carrying out an annealing heat treatment for oxidizing and crystallizing the amorphous material filing the trench so as to form, in the trench, an electrically conductive electrode.

2. The process according to claim 1, wherein producing the trench comprises performing an etching.

3. The process according to claim 1, wherein filling the trench comprises depositing the amorphous material by CVD (chemical vapor deposition) or ALD (atomic layer deposition).

4. The process according to claim 1, wherein implanting particles comprises performing a plasma ion implantation.

5. The process according to claim 1, wherein the amorphous material is amorphous silicon and the electrode is crystallized silicon or polysilicon.

6. The process according to claim 1, further comprising, before implanting particles, performing a chemical-mechanical polishing to remove the layer of amorphous material filing the trench deposited on top of the front face of the base semiconductor substrate.

7. The process according to claim 1, further comprising, before filling, producing an intermediate dielectric layer on walls of the trench.

8. The process according to claim 7, further comprising, before implanting particles, performing a chemical-mechanical polishing to remove a portion of the intermediate dielectric layer deposited on top of the front face of the base semiconductor substrate.

9. The process according to claim 7, wherein the intermediate dielectric layer is made of silicon oxide.

10. The process according to claim 1, further comprising covering the front face of the base semiconductor substrate with a temporary layer that forms a mask and wherein producing comprises performing an etching through the mask.

11. The process according to claim 10, further comprising, after the carrying out an annealing heat treatment, removing the temporary layer.

12. The process according to claim 10, further comprising: selectively chemically etching to recess a front portion of the filler to a depth which corresponds to a thickness of the temporary layer.

13. The process according to claim 10, wherein the temporary layer is silicon nitride.

14. The process according to claim 1, further comprising depositing a front dielectric layer on top of the front face of the base semiconductor substrate and covering the electrically conductive electrode.

15. The process according to claim 14, further comprising depositing a local electrically conductive layer on the front dielectric layer and above the electrically conductive electrode.

16. The process according to claim 1, wherein the particles implanted into the portion of the amorphous material filing the trench comprise fluorine.

17. The process according to claim 1, wherein the implanted particles counter the formation, as a result of carrying out the annealing heat treatment, of bubbles or craters at an upper surface of the electrically conductive electrode.

18. The process according to claim 1, wherein filling the trench with the amorphous material comprises depositing the amorphous material in the trench so that an upper surface of the amorphous material filling the trench is coplanar with the front face of the base semiconductor substrate, and wherein the first portion of the amorphous material is adjacent the upper surface.

19. The process according to claim 1, wherein filling the trench with the amorphous material comprises completely filling the trench with the amorphous material.

20. An electronic device, comprising:
 a base semiconductor substrate having a front face and including a trench extending into the base semiconductor substrate from the front face; and
 an electrically conductive electrode filling the trench and insulated from the base semiconductor substrate;
 wherein a first portion of the electrically conductive electrode located adjacent the front face of the base semiconductor substrate comprises particle implants or inclusions and wherein a second portion of the filler material that is located in the trench below the first portion does not have said particle implants or inclusions.

21. The device according to claim 20, further comprising an intermediate dielectric layer that covers the walls of the trench; the intermediate dielectric layer being interposed between the walls of the trench and the electrically conductive electrode.

22. The device according to claim 20, further comprising a front dielectric layer on top of the front face of the base semiconductor substrate and covering the electrically conductive electrode.

23. The device according to claim 22, further comprising a local electrically conductive layer on top of the front dielectric layer and above the electrically conductive electrode.

24. The device according to claim 20, wherein the particle implants or inclusions comprise fluorine.

25. The device according to claim 20, wherein the particle implants or inclusions counter the formation of bubbles or craters at an upper surface of the electrically conductive electrode.

26. The device according to claim 20, wherein the electrically conductive electrode filling the trench is made of an annealed amorphous material forming a crystallized material including said first and second portions.

* * * * *

UNITED STATES PATENT AND TRADEMARK OFFICE
CERTIFICATE OF CORRECTION

PATENT NO. : 11,251,053 B2  
APPLICATION NO. : 16/990556  
DATED : February 15, 2022  
INVENTOR(S) : Joel Schmitt et al.

Page 1 of 1

It is certified that error appears in the above-identified patent and that said Letters Patent is hereby corrected as shown below:

On the Title Page

(73) Assignee should read:  
STMicroelectronics (Crolles 2) SAS, Crolles (FR)

Signed and Sealed this  
Fourth Day of October, 2022

Katherine Kelly Vidal  
*Director of the United States Patent and Trademark Office*